United States Patent
Peters et al.

(10) Patent No.: US 7,906,815 B2
(45) Date of Patent: Mar. 15, 2011

(54) INCREASED RELIABILITY FOR A CONTACT STRUCTURE TO CONNECT AN ACTIVE REGION WITH A POLYSILICON LINE

(75) Inventors: Carsten Peters, Dresden (DE); Ralf Richter, Dresden (DE); Kai Frohberg, Niederau (DE)

(73) Assignee: Advanced Micro Devices, Inc., Austin, TX (US)

( * ) Notice: Subject to any disclaimer, the term of this patent is extended or adjusted under 35 U.S.C. 154(b) by 274 days.

(21) Appl. No.: 12/056,362

(22) Filed: Mar. 27, 2008

(65) Prior Publication Data
US 2009/0085030 A1   Apr. 2, 2009

(30) Foreign Application Priority Data
Sep. 29, 2007   (DE) .......................... 10 2007 046 843

(51) Int. Cl.
*H01L 21/70* (2006.01)
(52) U.S. Cl. .. 257/377; 257/367; 257/380; 257/E29.156; 438/199
(58) Field of Classification Search .................... 257/377
See application file for complete search history.

(56) References Cited

U.S. PATENT DOCUMENTS

| 5,427,964 A | * | 6/1995 | Kaneshiro et al. | 438/231 |
| 6,081,016 A | | 6/2000 | Tanaka et al. | 257/377 |
| 6,083,847 A | | 7/2000 | Kuo | 438/745 |
| 6,468,899 B1 | | 10/2002 | Choi | 438/651 |

FOREIGN PATENT DOCUMENTS

DE   102005063092 B3   7/2007

OTHER PUBLICATIONS

Translation of Official Communication from German Patent Office for German Patent Application No. 10 2007 046 843.3 dated May 14, 2009.

* cited by examiner

*Primary Examiner* — Ajay K Arora
(74) *Attorney, Agent, or Firm* — Williams, Morgan & Amerson, P.C.

(57) ABSTRACT

By forming a direct contact structure connecting, for instance, a polysilicon line with an active region on the basis of an increased amount of metal silicide by removing the sidewall spacers prior to the silicidation process, a significantly increased etch selectivity may be achieved during the contact etch stop layer opening. Hence, undue etching of the highly doped silicon material of the active region would be suppressed. Additionally or alternatively, an appropriately designed test structure is disclosed, which may enable the detection of electrical characteristics of contact structures formed in accordance with a specified manufacturing sequence and on the basis of specific design criteria.

14 Claims, 8 Drawing Sheets

INCREASED RELIABILITY FOR A CONTACT STRUCTURE TO CONNECT AN ACTIVE REGION WITH A POLYSILICON LINE

BACKGROUND OF THE INVENTION

1. Field of the Invention

The present disclosure relates to the field of semiconductor manufacturing, and, more particularly, to the formation of an interconnect structure having a contact plug for directly connecting a polysilicon line with an active region.

2. Description of the Related Art

Semiconductor devices, such as advanced integrated circuits, typically contain a large number of circuit elements, such as transistors, capacitors and the like, which are usually formed in a substantially planar configuration on an appropriate substrate having formed thereon a crystalline semiconductor layer. Due to the large number of circuit elements and the required complex layout of modern integrated circuits, the electrical connections of the individual circuit elements generally may not be established within the same level on which the circuit elements are manufactured, but require one or more additional "wiring" layers, which are also referred to as metallization layers. These metallization layers generally include metal-containing lines, providing the inner-level electrical connection, and also include a plurality inter-level connections, which are also referred to as "vias," that are filled with an appropriate metal and provide the electrical connection between two neighboring stacked metallization layers.

To establish the connection of the circuit elements to the metallization layers, an appropriate vertical contact structure is provided that connects to a respective contact region of a circuit element, such as a gate electrode and the drain/source regions of transistors, and to a respective metal line in the first metallization layer. The vertical contact structure, including a plurality of contacts or contact plugs, is formed in an interlayer dielectric material that encloses and passivates the circuit elements. In some circuit configurations, a connection of individual areas of a circuit element with other individual areas of the same or other circuit elements, such as a connection from a gate electrode or a polysilicon line to an active semiconductor region, such as a drain/source region, may be established by means of the contact structure on the basis of respective contact regions, without requiring a conductive path via the metallization level. One example in this respect is the wiring scheme of certain memory devices in which respective contact trenches, i.e., substantially rectangular contacts, connect the gate electrode or polysilicon lines with a drain/source region.

Figure 1A:
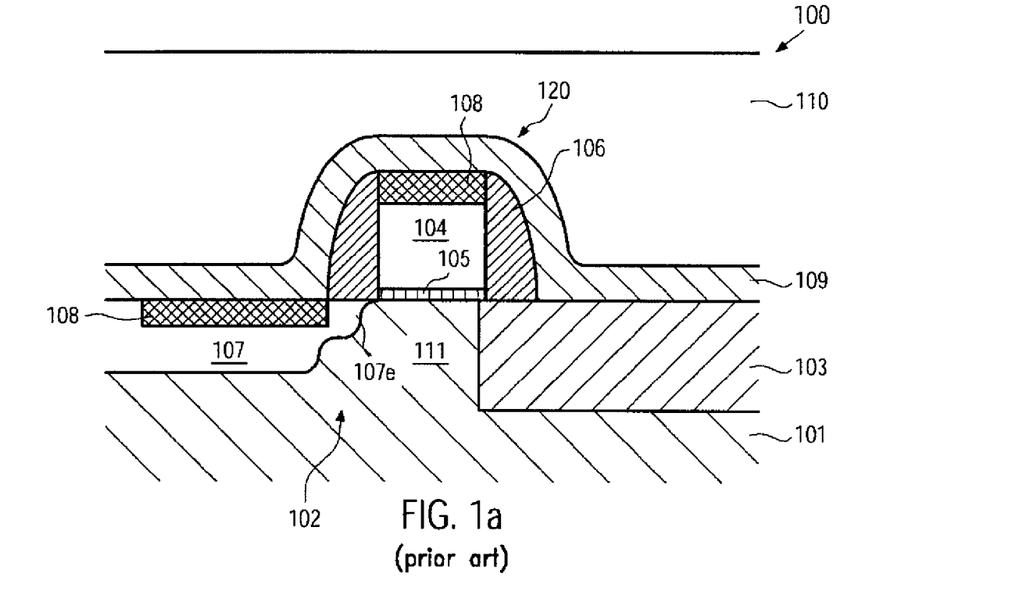
FIGS. 1a-1b schematically illustrate cross-sectional views of a conventional semiconductor device during the formation of a contact structure for directly connecting a polysilicon line and highly doped areas, such as drain/source regions, in an active semiconductor region during various manufacturing stages in accordance with conventional techniques, which may result in an increased risk for leakage current or short circuits.
Figure 1B:
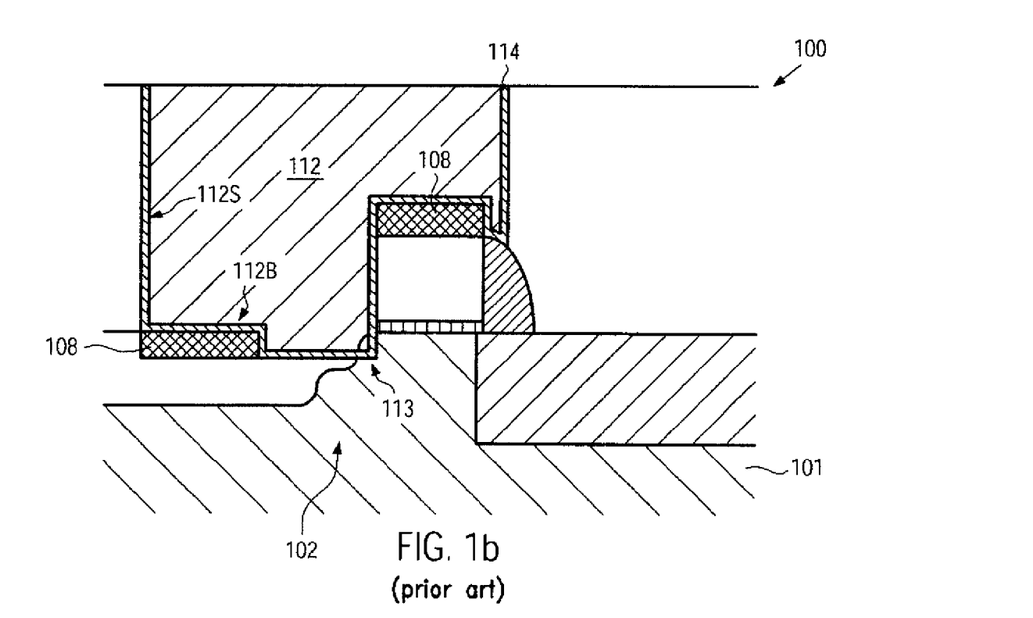

During the formation of respective contact structures directly connecting individual contact regions of circuit elements, however, a plurality of issues may arise, in particular for highly advanced semiconductor devices having critical feature sizes of 100 nm and even less, which may lead to yield loss due to increased leakage currents. With reference to FIGS. 1a-1b, a typical conventional process flow for forming respective contact structures for directly connecting polysilicon lines or gate electrodes with respective active semiconductor regions, i.e., drain/source regions, will be described in more detail in order to more clearly demonstrate the problems involved therein.

FIG. 1a schematically shows a semiconductor device 100, which may represent any appropriate circuit, in which a direct contact region may be formed to connect adjacent circuit regions. The semiconductor device 100 may comprise a substrate 101, which may represent any appropriate substrate, such as a bulk silicon substrate, a silicon-on-insulator (SOI) substrate and the like. The substrate 101 has formed thereon a substantially crystalline semiconductor layer 102 on and in which respective circuit elements are formed, one of which is indicated as element 120. A trench isolation 103 may be formed within the semiconductor layer 102 to define an active semiconductor region 111, which is to be understood as a doped semiconductor region, in which at least a portion is configured in substantially the same way as a drain or source region of a field effect transistor of the device 100. Consequently, the active region 111 may comprise implanted areas 107, 107e, which may conveniently be referred to as drain/source regions 107 with respective extension regions 107e. Moreover, the device 100 may comprise a polysilicon line 104, a portion of which may be formed above the active region 111 and which may be separated therefrom by an insulation layer 105, wherein the polysilicon line 104 may be substantially formed according to design criteria as are also used for the formation of gate electrode structures in the device 100 or according to the design criteria for advanced memory devices. On sidewalls of the polysilicon line 104, respective sidewall spacers 106 may be formed which are typically comprised of silicon nitride. Respective metal silicide regions 108 may be formed on top of the polysilicon line 104 and in a portion of the active region 111 that is not covered by the polysilicon line 104 and the spacers 106. For convenience, this portion may also be referred to as the drain/source region 107. Moreover, a contact etch stop layer 109, typically comprised of silicon nitride, may be formed on the active region 111 and the polysilicon line 104 including the sidewall spacers 106. Finally, an interlayer dielectric material 110 may be formed above the circuit element 120 represented by the polysilicon line 104 and the active region 111 so as to enclose and passivate the circuit element 120.

A typical process flow for forming the semiconductor device 100 as shown in FIG. 1a may comprise the following processes. The insulation layer 105 and the polysilicon line 104 may be formed on the basis of well-established oxidation, deposition, photolithography and etch techniques, wherein lateral dimensions of the polysilicon line 104 may be formed in accordance with device requirements, wherein, in sophisticated devices, the lateral dimension may be approximately 100 nm and even less. Thereafter, the sidewall spacers 106 may be formed by well-established deposition and anisotropic etch techniques, wherein, prior to and after the formation of the sidewall spacer 106, appropriate implantation processes may be performed in order to form the source/drain region 107 including the extension region 107e. Next, the metal silicide regions 108 may be formed, for instance, by depositing an appropriate refractory metal and initiating a silicidation process on the basis of an appropriate heat treatment. After the removal of any excess material, the contact etch stop layer 109 may be formed on the basis of well-established plasma enhanced chemical vapor deposition (PECVD) techniques followed by the deposition of the interlayer dielectric material 110, which is typically comprised of silicon dioxide. After any planarization processes, such as chemical mechanical polishing (CMP) and the like, for providing a substantially planar surface of the interlayer dielectric material 110, an appropriate photolithography process may be performed on the basis of a corresponding photolithography mask in order to form a resist mask (not shown) having respective openings corresponding to respective contact openings to be formed above the polysilicon line 104 and the drain/source region 107 to establish a direct electric connection therebetween. Based on a corresponding resist mask, an anisotropic etch process may be performed, which may then be stopped in and on the contact etch stop layer 109 due to the high etch selectivity of the corresponding etch recipe for etching through the silicon dioxide material of the layer 110. Subsequently, a further etch step may be performed to open the contact etch stop layer 109 in order to contact the polysilicon line 104, i.e., the respective metal silicide region 108 formed thereon, and the drain/source region 107, i.e., the corresponding metal silicide region 108 formed therein. During the respective etch process, the sidewall spacers 106, at least at the side of the drain/source region 107, may also be completely removed, since the contact etch stop layer 109 and the spacers 106 are comprised of the same material and a certain degree of over etch is required to reliably expose the respective metal silicide regions 108. Consequently, during this over etch time, the etch front may also attack the extension region 107e, after having removed the sidewall spacer 106, so that the etch front may penetrate the extension region 107e to a certain degree, thereby possibly creating a conductive path to the remaining active region 111 or at least providing a significant risk of increased leakage currents of the resulting electric connection.

FIG. 1b schematically shows the semiconductor device 100 after the completion of the above-described process sequence. Moreover, the semiconductor device 100 comprises a contact region 112, which may be filled with a conductive material, such as tungsten, wherein, at sidewall portions 112S and bottom portions 112B, a conductive barrier material, such as titanium and the like, may be provided. Since the contact region 112 is connected to the respective metal silicide regions 108 of the polysilicon line 104 and the drain/source region 107, a direct electrical connection between these two device areas is established. Moreover, as previously indicated, the etch process for forming a respective contact opening in the interlayer dielectric material 110 and the contact etch stop layer 109 may have created a recess 113 in the extension region 107e, which may even extend into the active region 111 below the extension region 107e, which may be referred to as well region, thereby possibly creating a short or at least a current path for increased leakage currents. Subsequently, the contact region 112 may be formed on the basis of well-established recipes, comprising, for instance, the deposition of the barrier layer 114 in accordance with well-established chemical vapor deposition (CVD) and physical vapor deposition (PVD) techniques, followed by any appropriate fill technique, such as CVD on the basis of appropriate precursor materials. After removal of any excess material of the barrier material and the conductive material comprising the contact region 112, a further passivation layer may be deposited.

As a result, the conventional technique may lead to increased leakage currents or even short circuits between portions 113 of the active region 111 that are inversely doped with respect to the drain/source regions 107 and the extension regions 107e, thereby significantly negatively affecting the performance of the device 100. In particular, for aggressively scaled semiconductor devices, the polysilicon lines 104, which may be used to connect to highly scaled active regions in memory areas of the device 100, are separated by isolation structures of reduced dimensions, while also the lateral dimensions of the polysilicon lines 104 may be in the range of 60 nm and less for aggressively scaled semiconductor devices. In this case, the control of the etch process may suffer from increased process variability, thereby further reducing yield and performance of the devices.

The present disclosure is directed to various devices and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique for enhancing the controllability of the manufacturing process for forming contact structures including direct connections between a conductive line and an active semiconductor region to provide enhanced reliability of the corresponding contact structures in view of short circuits and leakage currents. To this end, according to illustrative aspects disclosed herein, the etch selectivity during the formation of contact openings may be enhanced by providing a metal silicide at least at the contact region during the etch process for forming the contact opening, thereby substantially avoiding a direct attack of silicon-based materials at the bottom of the contact opening. Since metal silicide may have a significantly increased etch resistivity with respect to the contact etch chemistry compared to doped silicon material, etching into the depth of the active region upon opening the contact etch stop layer may be substantially avoided or at least significantly reduced. Therefore, the probability of creating any short circuits or increased leakage paths upon refilling the contact opening may be reduced, thereby enhancing the overall reliability and production yield during the formation of this type of contact structure. According to still another illustrative aspect disclosed herein, the manufacturing process sequence for forming contact structures providing a direct electrical contact between a conductive line, such as a polysilicon line, and an active region may be monitored on the basis of an appropriately designed test structure, which may comprise a plurality of respective contact structures formed on the basis of specific design criteria. Based on this test structure, the magnitude of leakage currents or any other electrical characteristics correlated with the quality of the contact structures in the test structure may be evaluated with respect to the specified design criteria, thereby obtaining valuable information with respect to actual contact structures provided in product devices. Consequently, the process flow under consideration may be effectively monitored wherein, in some illustrative aspects, the provision of a plurality of test structures formed on the basis of different design criteria may enable the selection of appropriate parameters for actual product devices.

One illustrative method disclosed herein comprises forming a conductive line above an active region of a semiconductor device. The method further comprises defining a dopant profile in the active region and removing the sidewall spacer at least in a contact region for forming a contact connecting to the active region and the conductive line. Moreover, the method comprises forming a metal silicide in the active region after removing the sidewall spacer from at least the contact region and forming a dielectric material including an etch stop layer above the active region. Finally, a contact structure is formed in the contact region.

One illustrative semiconductor device disclosed herein comprises an active region defined in a semiconductor layer and an isolation structure bordering the active region. The semiconductor device further comprises a conductive line formed above a portion of the active region. Furthermore, a metal silicide region is formed on a portion of the active region adjacent to the conductive line and a contact structure is provided that is comprised of a conductive material, wherein the conductive material is separated from material of the active region by the metal silicide region.

A further illustrative semiconductor device disclosed herein comprises a test structure. The test structure comprises a plurality of active regions formed in a semiconductor layer of the semiconductor device. Furthermore, the test structure includes a plurality of isolation structures positioned to isolate the plurality of active regions from each other. Additionally, a plurality of conductive lines is provided wherein each of the plurality of conductive lines extends from above one of the plurality of active regions to above another one of the plurality of active regions to form a chain of conductive lines. Finally, the test structure further comprises a plurality of contact structures positioned to connect each of the plurality of conductive lines with the plurality of active regions.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for forming and monitoring contact regions, i.e., metal-filled regions within an interlayer dielectric material for electrically connecting respective highly doped areas of active regions, for instance, contact areas of circuit elements, such as field effect transistors, with conductive lines extending above the active region, for instance, from an isolation structure into the active region, such as polysilicon lines, gate electrode structures and the like. The direct connection, i.e., an electrical connection without an interconnection via the first metallization layer, may frequently be used in specific circuit designs, such as bit cells of memory areas and the like. As previously explained, the probability of creating leakage paths or short circuits during the formation of direct contact structures may reduce performance and increase yield loss, in particular for aggressively scaled semiconductor devices. Consequently, the principles disclosed herein may provide increased reliability during the formation of the contact structures, wherein, according to one illustrative aspect, the manufacturing sequence itself may be enhanced by increasing the etch selectivity during the etching through the contact etch stop layer by providing a metal silicide material at the exposed area, which may have a significantly higher etch selectivity to the etch chemistry compared to doped silicon material. To this end, the sidewall spacer structure of the conductive line may be removed prior to the formation of the metal silicide in the active region and within the conductive line, at least in an area corresponding to the contact opening to be formed in a later manufacturing stage. Thus, the metal silicide provides an efficient interface between the metal of the contact structure and the underlying silicon area, thereby reducing the probability of etching into the silicon area, which may conventionally result in increased leakage paths to the body region, i.e., the substrate or well region of the active semiconductor region. According to further illustrative aspects disclosed herein, additionally or alternatively, the overall manufacturing sequence for forming the direct contact structures may be monitored and thus evaluated on the basis of an appropriately designed test structure, which may comprise a plurality of active regions and respective conductive line portions connected to the respective active regions by direct contact structures. Consequently, by determining electrical characteristics, such as the leakage current from the highly doped areas of the active semiconductor regions into the well or substrate region thereof, the quality of the overall manufacturing sequence may be evaluated, wherein, in some illustrative aspects, the test structure may be formed in accordance with predefined design criteria so as to determine appropriate process margins of the actual manufacturing sequence. In other cases, a plurality of different design criteria may be used for forming a plurality of test structures in order to obtain statistically relevant measurement data for a plurality of different process conditions.

It should be appreciated that the subject matter disclosed herein may be employed in sophisticated integrated circuits having transistor elements with a gate length of 90 nm and less, since, in these semiconductor devices, very tight process margins also have to be applied to direct contact structures to be formed on the basis of highly doped regions having a vertical and lateral dopant concentration that corresponds to the dopant concentration in the sophisticated transistor devices. Moreover, the respective conductive line and the dimensions of the isolation structures may also have to be adapted to the reduced features sizes of the advanced transistor elements, thereby even further increasing the probability of creating increased leakage currents unless efficient process and control alternatives may be used. However, the principles disclosed herein may also be applied to less critical applications and thus the embodiments should not be considered as being restricted to any specific device dimensions, unless such restrictions are explicitly set forth in the specification or in the appended claims.

Figure 2A:
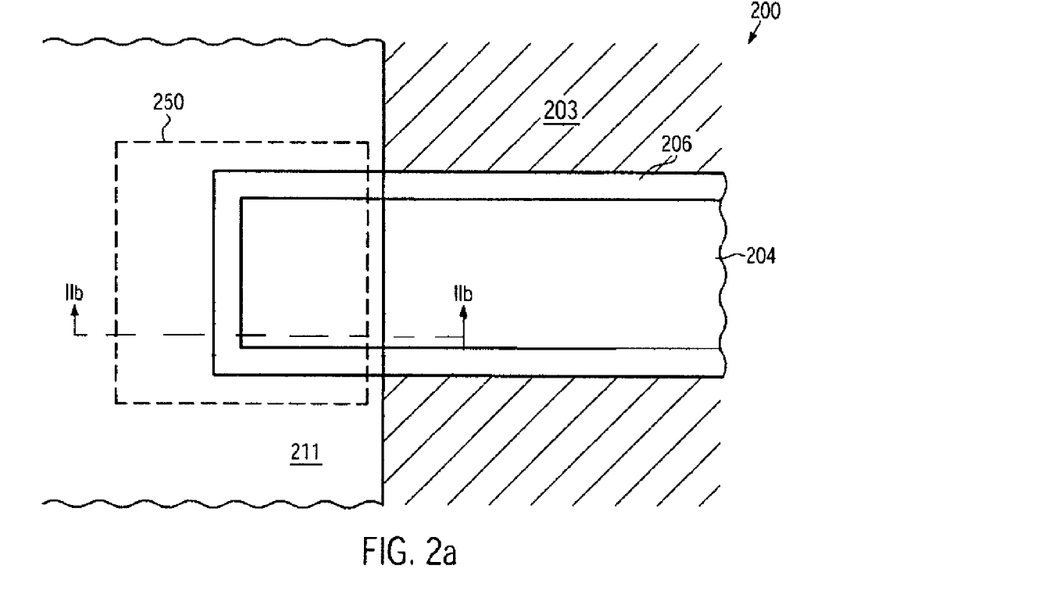
FIG. 2a schematically illustrates a top view of a semiconductor device receiving contact openings and the basis of a device configuration that provides enhanced etch selectivity during the formation of the contact openings according to illustrative embodiments.

FIG. 2a schematically illustrates a top view of a semiconductor device 200 that may represent a device region in which a direct contact structure between a device feature, such as a gate electrode structure, a conductive line or any other feature formed above an active area, is to be connected with the highly doped portion of an active area, substantially without creating undesired leakage paths between the conductive line and the substrate area or well area of the active semiconductor region. Consequently, the semiconductor device 200, as shown in FIG. 2a, is to be considered as an illustrative example for forming a direct contact between a device feature, such as a gate electrode, a conductive line and the like, and the highly doped portions of active semiconductor regions.

In this respect, an active semiconductor region is to be understood as a semiconductor material comprising a specific lateral and vertical dopant concentration distribution as is required for the formation of transistor elements so as to define drain and source regions therein. Furthermore, typically, an active semiconductor region comprises a body region with a significantly reduced dopant concentration or a substantially intrinsic conductivity, wherein the reduced dopant concentration is typically of an opposite conductivity type compared to the highly doped portions. For example, in active semiconductor regions designed to form N-channel transistors therein, the highly doped portions comprise an N-type dopant while the remaining semiconductor material, i.e., the body region, may comprise a significantly reduced concentration of a P-type dopant material. That is, a semiconductor substrate, such as a silicon substrate, may be provided with a basic P-dopant concentration so that the body region of a respective active semiconductor region may correspond to a portion of the pre-doped substrate. On the other hand, if an active semiconductor region would be provided within the P-doped substrate so as to enable the formation of P-channel transistors, a specific area of the substrate may be doped with an N-type dopant to create a well region having an overall N-type conductivity. In this well region, a highly doped P-conductivity may be locally provided while the remaining part of the well region may thus act as the body region of the active semiconductor region. It should be appreciated that other doping regimes may be used, such as an N-doped substrate and the like. Furthermore. it should be appreciated that, in some device configurations, a buried insulating layer may be provided to electrically isolate a respective semiconductor layer in the depth direction, wherein individual active semiconductor regions may be substantially completely isolated from each other in the lateral direction by providing an appropriate isolation structure.

In FIG. 2a, the semiconductor device 200 may comprise a conductive line 204, which may represent a gate electrode structure of a transistor, or a line connected to different device areas, and the like. In the example shown in FIG. 2a, the conductive line 204 may extend above an active semiconductor region 211, which may have any appropriate configuration, as explained above. Furthermore, an isolation structure 203 may be provided, which may be designed so as to delineate the active region 211 from other active regions (not shown). In the example shown, the conductive line 204 may also extend above the isolation structure 203. The conductive line 204 may be comprised of any appropriate conductive material, such as polysilicon, metal-containing materials and the like. As will be explained later on in more detail, the conductive line 204 may be formed on an insulating material so as to avoid direct contact of the conductive material of the line 204 with a body region of the active region 211. Furthermore, in the manufacturing stage in FIG. 2a, a sidewall spacer 206 may be provided on sidewalls of the conductive line 204. Moreover, an area 250 is illustrated that corresponds to a contact region still to be formed to connect the conductive line 204 with the active region 211, i.e., with a highly doped portion thereof, as will be described later on in more detail.

Figure 2B:
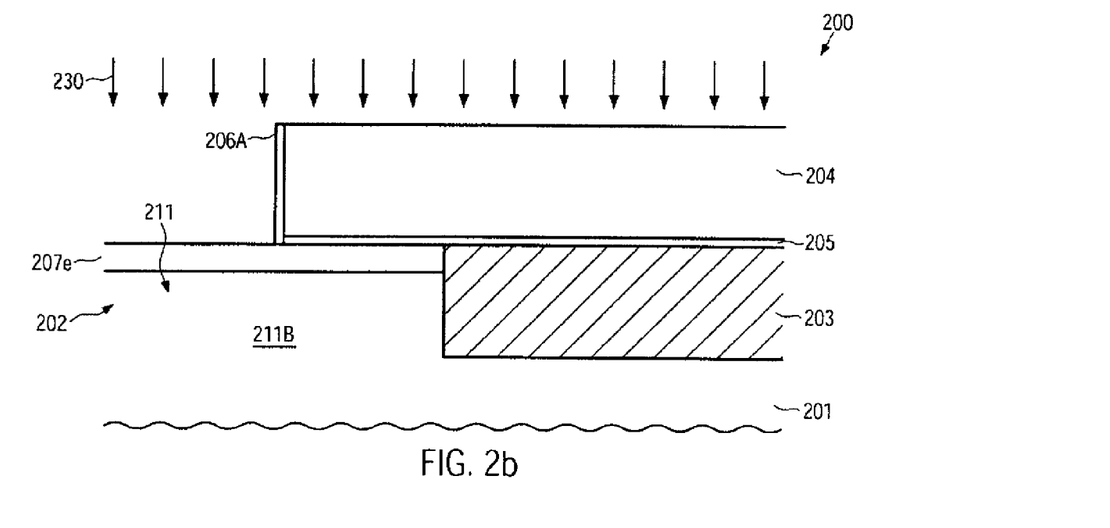
FIGS. 2b-2h schematically illustrate cross-sectional views of the semiconductor device of FIG. 2a during various manufacturing stages wherein a conductive line formed above an active region and an isolation structure obtains a contact structure for directly connecting the conductive line with the active region, i.e., with a highly doped portion thereof, with a significantly reduced probability for creating leakage paths due to the provision of metal silicide as an interface between the contact structure and the active region according to illustrative embodiments.

FIG. 2b schematically illustrates a cross-sectional view taken along the line IIb as illustrated in FIG. 2a. Furthermore, it should be appreciated that the semiconductor device 200 as shown in FIG. 2b may correspond to an earlier manufacturing stage, i.e., to a manufacturing stage prior to the formation of the sidewall spacer 206. Moreover, as shown, the semiconductor device 200 may comprise a substrate 201, which may represent any appropriate carrier material for forming thereon a silicon-based semiconductor layer 202. As previously explained, the substrate 201 may represent a semiconductor material, such as a silicon-containing semiconductor material, an upper portion of which may represent the semiconductor layer 202. Thus, in this case, a body region 211B of the active semiconductor region 211 may be electrically connected with the substrate 201. In other cases, as explained above, the body region 211B may be formed within the substrate 201, however, on the basis of a dopant material having the opposite conductivity type so as to establish a PN junction between the body region 211B and the substrate 201, thereby insulating the body region 211B from the substrate 201, at least for one current flow direction. In still other cases, the substrate 201 may have formed thereon a buried insulating layer (not shown), on which may be formed the semiconductor layer 202. Moreover, the isolation structure 203, which may be provided in the form of a trench isolation structure, is formed in the semiconductor layer 202 so as to define the active region 211. As shown, at least the portion of the conductive line 204 extending above the active region 211 may be formed on an insulating layer 205 which, depending on the device strategy, may also be formed above the isolation structure 203 or which may be substantially restricted to the active region 211, when the insulating layer 205 has been formed by oxidation techniques. For example, the insulation layer 205 may have the configuration of a gate dielectric layer as required for the formation of field effect transistors in and above the active region 211 or any other active regions of the device 200. Furthermore, in this manufacturing stage, sidewalls of the conductive line 204 may have formed thereon an offset spacer 206A that is designed to provide a certain offset during an implantation process for forming a highly doped portion 207e, which may correspond to drain and source extension regions of any transistor elements to be formed in and above the active region 211.

The semiconductor device as shown FIG. 2b may be formed on the basis of similar processes, as previously described with reference to the semiconductor device 100. That is, the insulating layer 205 and the conductive line 204 may be formed on the basis of the same process techniques as may also be used for the formation of gate electrode structures, wherein the dimensions of the conductive line 204, i.e., a width and a length thereof, may be selected on the basis of device requirements. As previously explained, in sophisticated semiconductor devices, the pitch between neighboring active regions as well as the dimensions thereof may have to be adapted to the overall reduced feature sizes of respective transistor elements, thereby also imposing restrictions on the dimensions of the conductive lines 204. In other cases, when the conductive line 204 represents a gate electrode structure, the length and width thereof may correspond to the respective transistor dimensions. Thus, after forming the conductive line 204, which in one illustrative embodiment may be comprised of polysilicon, the offset spacer 206A, if required, may be formed, for instance, on the basis of silicon dioxide, silicon nitride and the like. Thereafter, an implantation process 230 may be performed in order to create the highly doped portion 207e.

Figure 2C:
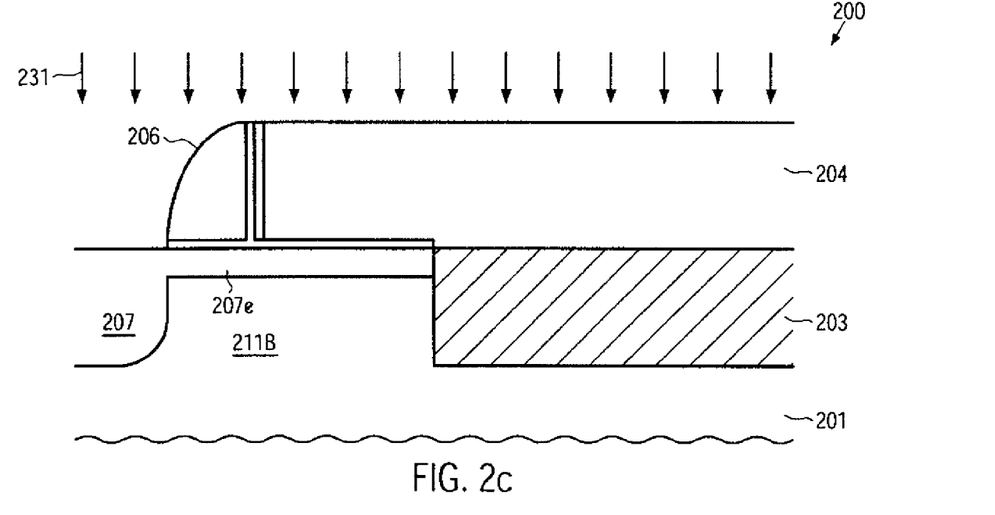

FIG. 2c schematically illustrates the semiconductor device 200 in a further advanced manufacturing stage, in which the spacer 206 may be formed on sidewalls of the conductive line 204, i.e., on the offset spacer 206A if provided. The spacer 206 may be formed of silicon nitride or any other appropriate material, such as silicon dioxide, silicon oxynitride and the like. The sidewall spacer 206 is designed such that a desired offset is obtained from respective gate electrode structures in order to define deep drain and source regions 207 within the active region 211 during a respective ion implantation process 231. Depending on the process strategy, any anneal processes may be performed to activate the dopants in the portions 207, 207e and also re-crystallize implantation-induced damage.

Figure 2D:
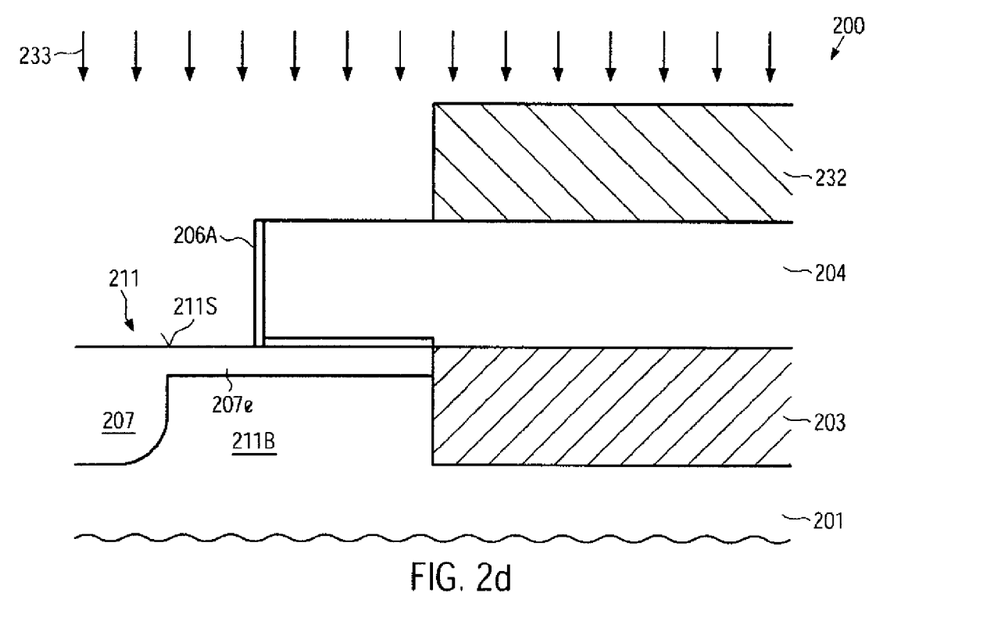

FIG. 2d schematically illustrates the semiconductor device 200 in a further advanced manufacturing stage in which, contrary to conventional strategies, the sidewall spacer 206 may be removed, at least locally, to expose the sidewall portions of the conductive line 204 at least within the contact regions 250 (FIG. 2a). In one illustrative embodiment, the removal of the sidewall spacer 206 may be accomplished on the basis of an appropriate etch mask 232, which may expose the contact region 250 or which may expose a portion including the contact region 250. The etch mask 232 may be provided in the form of a resist mask and the like.

During a selective etch process 233, the spacer 206 may be removed, for instance, on the basis of hot phosphoric acid, if an isotropic wet chemical etch process is to be used, wherein the material of the conductive line 204 and of the active region 211 may not be substantially attacked. Furthermore, if appropriate liner materials, for instance comprised of silicon dioxide and the like, may be provided, the etch process 233 may also remove the material of the sidewall spacer 206 selectively to the corresponding liner materials. Depending on the type of material used for the offset spacer 206A, if provided at all, the spacer 206A may also be maintained during the removal of the spacer 206. It should be appreciated that a certain amount of under-etching may occur during the isotropic etch process so that the sidewall spacer 206 may be reliably removed within the entire contact region 250, even if the same lithography mask may be used as will be used for the definition of the contact region 250 (see FIG. 2a) thereby relaxing any constraints with respect to overlay accuracy. In other illustrative embodiments, the etch process 233 may comprise a plasma-based anisotropic etch recipe for selectively removing the material of the spacer 206, wherein well-established parameters may be used, as for instance are also used during the formation of the sidewall spacer 206. In some illustrative embodiments, the etch process 233 may comprise a further etch step for removing a liner material, if provided, to reliably expose the semiconductor material of the active region 211. Consequently, an exposed surface portion 211S extends close to the sidewall of the conductive line 204.

Figure 2E:
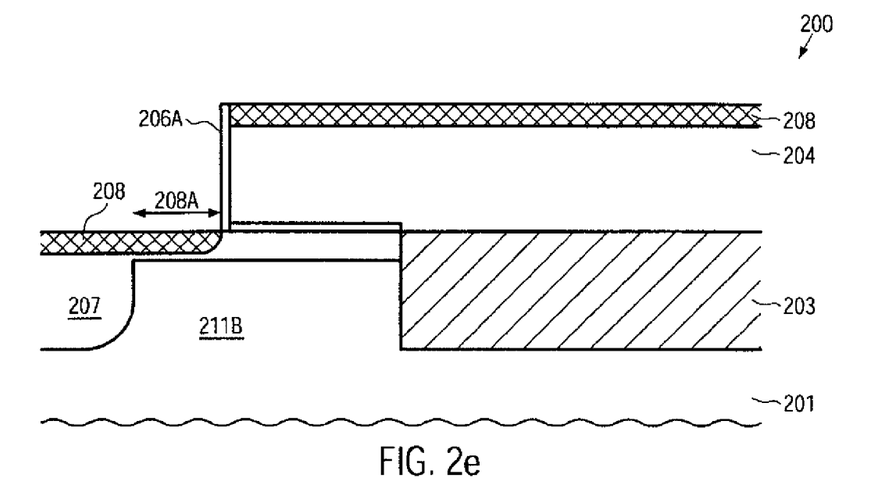

FIG. 2e schematically illustrates the semiconductor device 200 in a further advanced manufacturing stage. As shown, a metal silicide 208 may be formed in the surface portion 211S of the active semiconductor region 211 and also on top of the conductive line 204, if provided in the form of polysilicon. The metal silicide 208 may, due to the previous removal of the sidewall spacer 206 at least within the contact region 250, extend close to the conductive line 204, as indicated by arrow 208A. Consequently, the metal silicide 208 in the active region 211 provides an interface and thus an efficient etch stop material during the formation of the contact region 250 in a later manufacturing stage, since the metal silicide 208 may have a higher etch resistivity compared to the highly doped portion 207e, which may conventionally be exposed and etched in a conventional manufacturing strategy, as previously explained. The metal silicide 208 may be formed on the basis of substantially the same process techniques as explained above with reference to the semiconductor device 100.

Figure 2F:
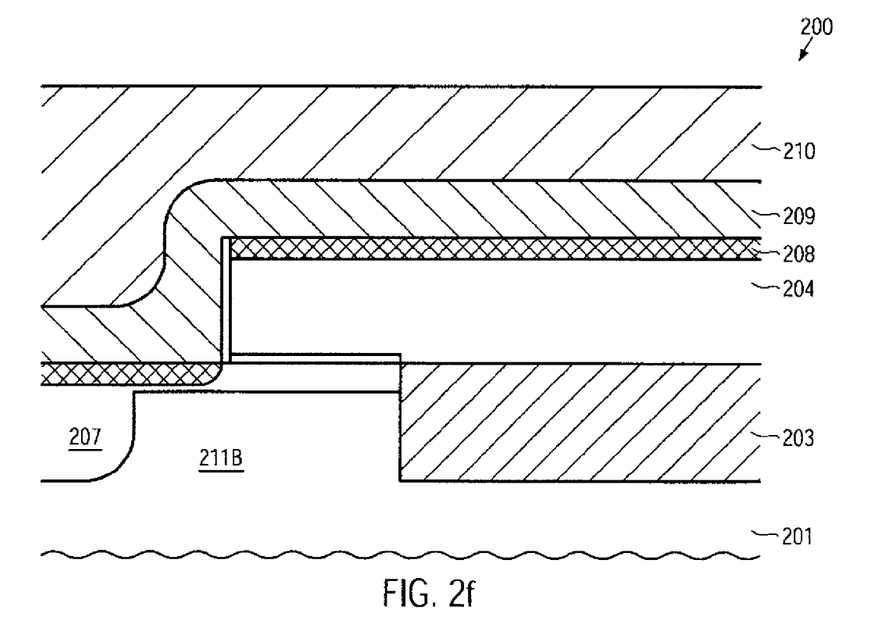

FIG. 2f schematically illustrates the semiconductor device 200 in a further advanced manufacturing stage, in which an interlayer dielectric material 210, for instance in the form of silicon dioxide and the like, is formed above the active region 211 and the conductive line 204, wherein an etch stop layer 209 may be provided, for instance in the form of a silicon nitride material, or any other appropriate material, such as silicon carbide, nitrogen-enriched silicon carbide and the like, which may provide a desired high etch selectivity with respect to the material 210. The etch stop layer 209 and the interlayer dielectric material 210 may be formed on the basis of well-established process techniques, as for instance described with reference to the semiconductor device 100.

Figure 2G:
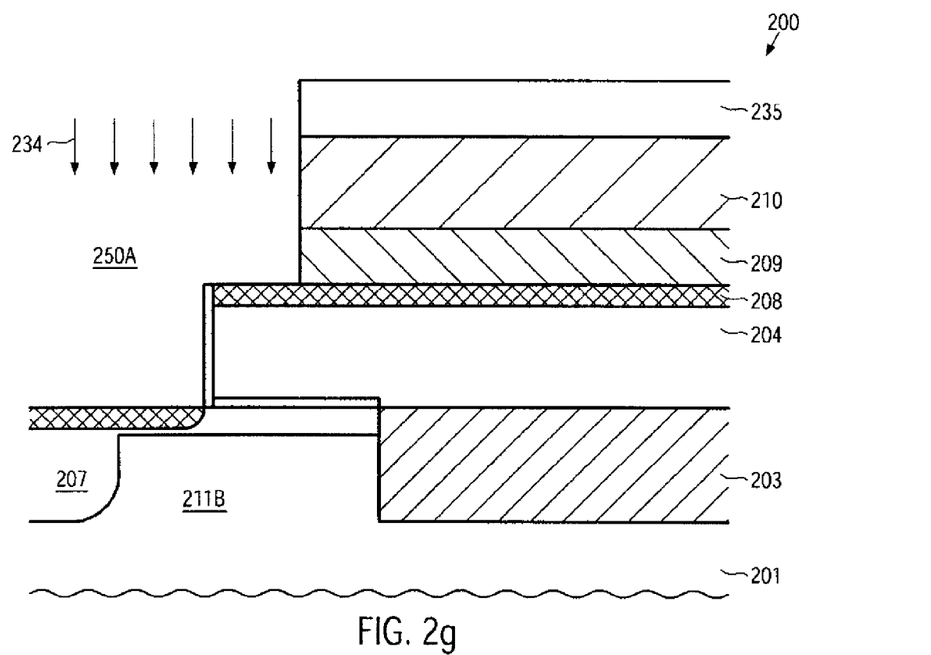

FIG. 2g schematically illustrates the semiconductor device 200 during an etch process 234 that is performed on the basis of an etch mask 235. The etch mask 235 may be positioned and dimensioned such that the contact region 250 (see FIG. 2a) may be defined in accordance with device requirements. For example, as previously explained, the etch mask 235 may be formed on the basis of the same lithography mask as may be used for removing a portion of the sidewall spacer 206, as previously discussed. Thus, during the etch process 234, an opening may be formed in the interlayer dielectric material 210 that corresponds to the contact region 250 and that is indicated by 250A. The etch process 234 may comprise a first main etch step to etch through the interlayer dielectric material 210, using the layer 209 as an efficient etch stop. In a further etch step, the layer 209 may be opened on the basis of an appropriate selective etch chemistry according to well-established strategies, as also discussed with reference to the semiconductor device 100. Thus, the final step of the etch process 234 may have a high etch selectivity with respect to the metal silicide material 208, thereby efficiently blocking an etch attack with respect to highly doped semiconductor material of the portion 207e. Consequently, since the metal silicide region 208 extends close to the conductive line 204, as indicated by the arrow 208A in FIG. 2e, the creation of any short circuits or leakage paths from the contact region 250 into the body region 211B may be significantly reduced or substantially completely avoided. Hence, the metal silicide 208 may act as an efficient interface or barrier with respect to any conductive material to be formed in the opening 250A in a subsequent process sequence.

Figure 2H:
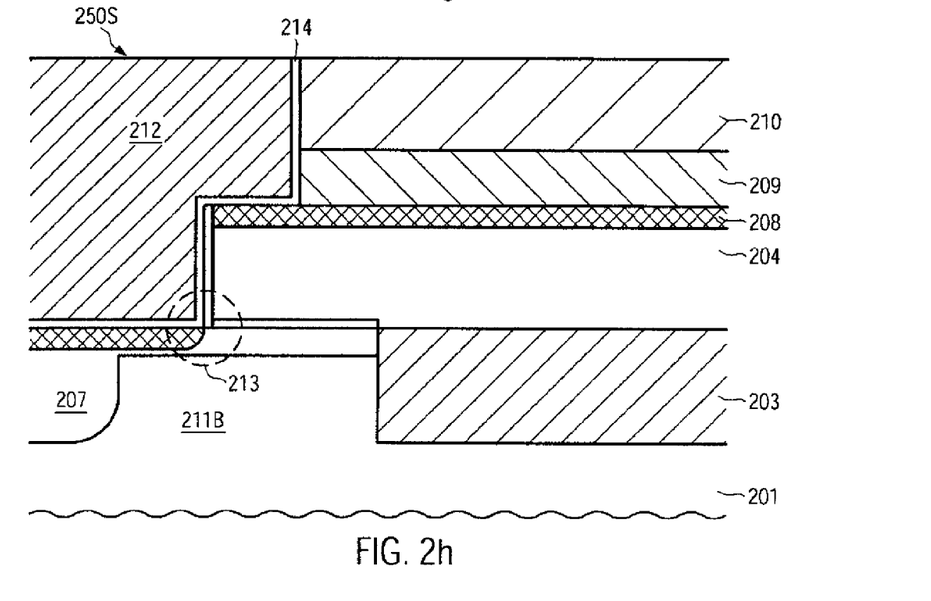

FIG. 2h schematically illustrates the semiconductor device 200 with a contact structure 250S formed in the opening 250A. The contact structure 250S may be indicated as a direct contact structure in the sense as previously explained, i.e., the contact structure 250S connects the conductive line 204 with the highly doped portion 207, 207e of the active region 211. The contact structure 250S may comprise a barrier material 214, for instance a titanium nitride material and the like, which may be used to enhance the deposition of a highly conductive material 212, such as tungsten and the like. It should be appreciated, however, that any appropriate material composition may be used for the contact structure 250S, depending on the process and device requirements. The contact structure 250S may be formed on the basis of any appropriate manufacturing regime, for instance by depositing the barrier layer 214, for instance by CVD, followed by the deposition of the material 212, wherein well-established recipes may be used, as previously explained with reference to the device 100. Consequently, due to the missing sidewall spacer 206, at least in the contact region 250, the probability of creating leakage paths or short circuits in an area 213 may be significantly reduced due to the presence of metal silicide, which may reliably act as an etch stop during formation of the contact opening 250A (see FIG. 2g).

Figure 2I:
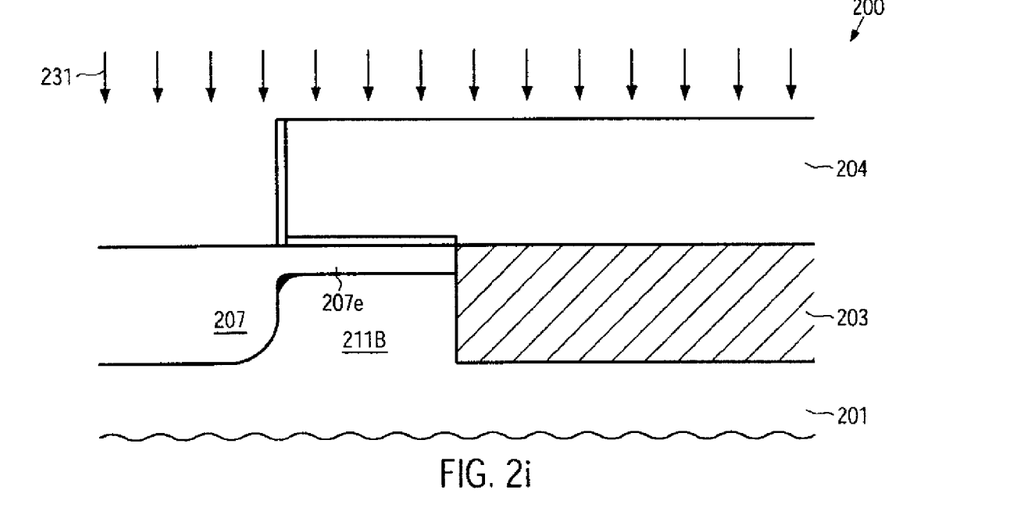
FIGS. 2i-2j schematically illustrate further illustrative embodiments in which a depth of the dopant profile at the "landing area" of the contact structure may be increased according to further illustrative embodiments.
Figure 2J:
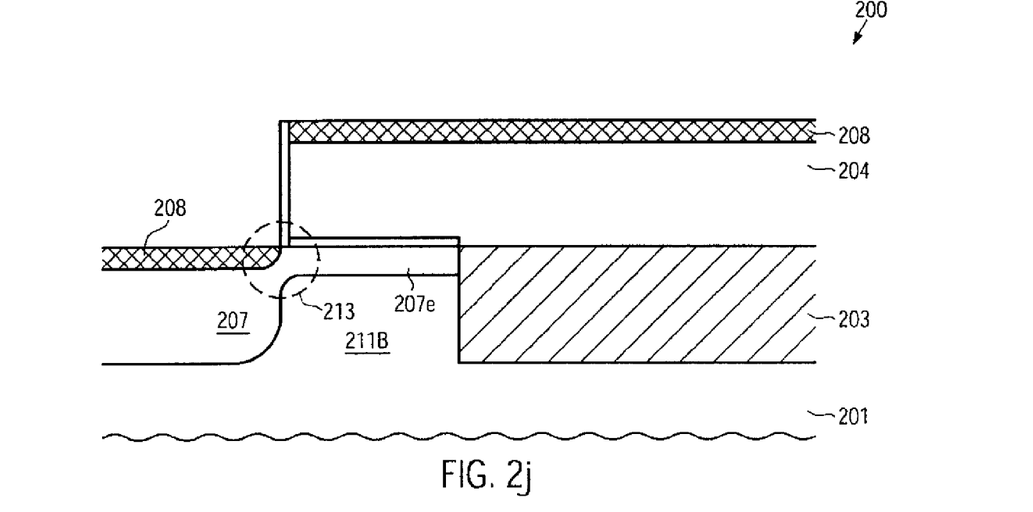

With reference to FIGS. 2i-2j, further illustrative embodiments will now be described, in which a respective sidewall spacer of the conductive line 204 may be removed at an earlier manufacturing stage.

FIG. 2i schematically illustrates the semiconductor device 200 in a manufacturing stage in which the shallow highly doped extension regions 207e may have been formed, for instance, on the basis of substantially the same process techniques as described above. Thereafter, the sidewall spacer 206 may be formed, followed by the provision of an appropriate etch mask, such as the etch mask 232 (see FIG. 2d) to at least expose the sidewall spacers 206 in the contact region 250. Based on this etch mask, the sidewall spacer 206 may be removed, as previously described. Next, the ion implantation process 231 may be performed, thereby creating the deep doped portion 207 so as to extend close to the conductive line with respect to the lateral direction. Consequently, an increased process margin may be obtained during the subsequent formation of metal silicide in the portions 207e, since the extension of the respective metal silicide in the depth direction may be less critical.

FIG. 2j schematically illustrates the semiconductor device 200 after the silicidation process, thereby providing the metal silicide 208 in the active region with less restrictive constraints in view of the portion 213. That is, during the silicidation process, the diffusion of metal into the doped silicon material may be less critical, since, due to the fact that the deep highly doped portion 207 extends to the sidewall of the conductive line 204, the dopant concentration at the area 213 may extend more deeply into the body region 211B. Thus, a short circuit during the silicidation in the area 213 may be reliably avoided. Thereafter, the further processing may be continued to form the contact structure 250S, as described above (FIG. 2h).

Figure 2K:
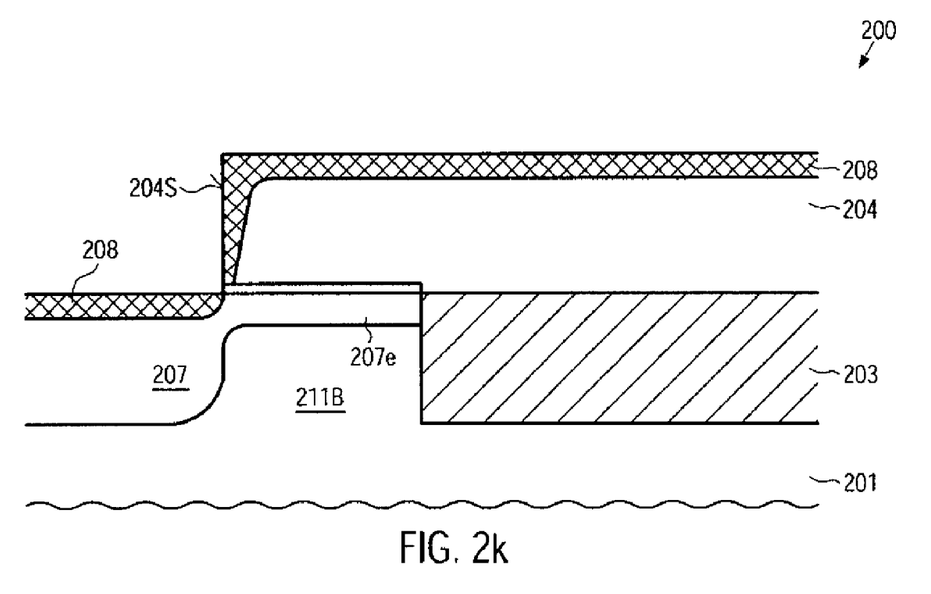
FIG. 2k schematically illustrates a semiconductor device in which the overall reliability and performance of a contact structure may be increased by additionally providing metal silicide at sidewall portions of the conductive line according to further illustrative embodiments.

FIG. 2k schematically illustrates the semiconductor device 200 according to a further illustrative embodiment, in which the overall conductivity and reliability of the contact structure 250S may be enhanced by providing metal silicide 208 also at sidewall portions 204S that have been exposed during the removal of the corresponding portion of the sidewall spacers 206. For this purpose, any offset spacer or a liner material 206A, which may still be present after the removal of the spacer 206, may be removed on the basis of an appropriately designed etch recipe, for instance on the basis of hydrofluoric acid, if the offset spacer 206A may be provided in the form of silicon dioxide. Consequently, during the subsequent silicidation process, the exposed sidewall portions 204S may also be converted into metal silicide, wherein an early removal of the sidewall spacers 206, as described above with reference to FIGS. 2i and 2j, may also be contemplated in order to obtain less critical process margins. Consequently, during the subsequent etch process for forming the contact opening 250A, the sidewall portions 204S may also exhibit a significantly increased etch resistivity compared to the polysilicon material, thereby further enhancing the overall process reliability. It should be appreciated that any under-etching of the insulation layer 205 may also result in the creation of a respective metal silicide in a corresponding untrenched area (not shown), thereby providing an efficient etch stop layer during the subsequent etch process. Thereafter, the further processing may be continued as described above.

As a consequence, the overall process robustness during the formation of the contact structure 250S may be enhanced by providing increased etch selectivity during the formation of the contact opening 250A using the increased metal silicide 208A as an efficient etch stop.

Figure 3A:
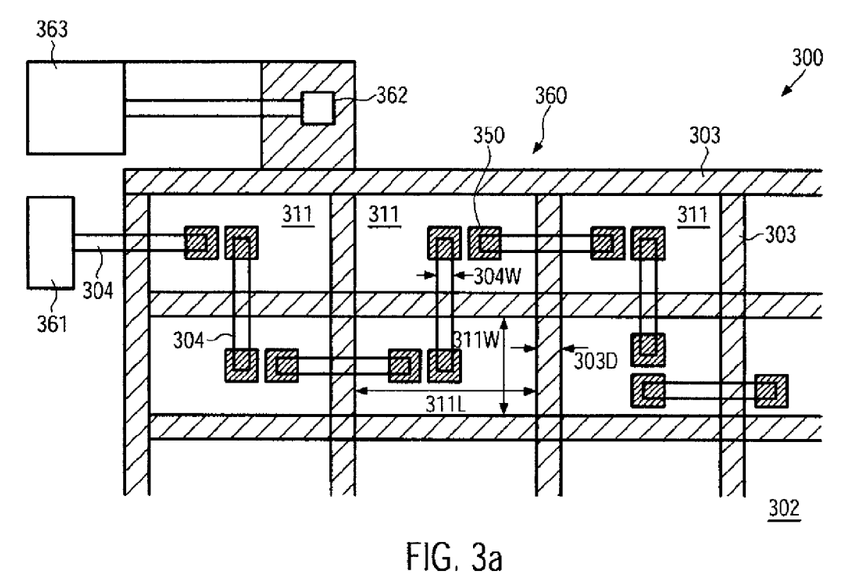
FIGS. 3a-3b schematically illustrate top views of a test structure including a plurality of contact structures so as to evaluate a corresponding process flow for specific design criteria according to still further illustrative embodiments.
Figure 3B:
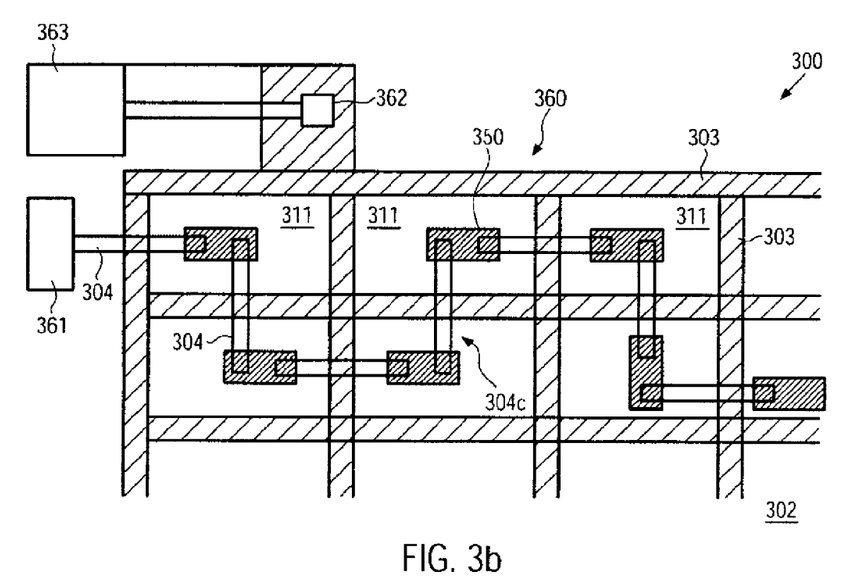

With reference to FIGS. 3a-3b, further illustrative embodiments will now be described in more detail, in which, additionally or alternatively to the above-described process techniques, a control or monitoring mechanism may be provided to evaluate the process for forming contact structures. To this end, an appropriately designed test structure may be provided, which may enable the detection of electrical characteristics of a plurality of contact structures, such as the contact structures of conventional design, such as the material 112 in combination with the barrier layer 114 of the device 100, or the contact structures 250S, as previously described.

FIG. 3a schematically illustrates a top view of a portion of a semiconductor device 300 comprising a test structure 360. The test structure 360 may be formed in a semiconductor layer 302, such as a silicon-based semiconductor layer that may have the same characteristics as discussed above with reference to the semiconductor layers 102 and 202. Furthermore, the semiconductor layer 302 may be formed on an appropriate substrate (not shown), such as the substrate materials 101, 201 as discussed above. The test structure 360 may comprise a plurality of active semiconductor regions 311, which may be defined within the semiconductor layer 302 on the basis of appropriately designed isolation structures 303. Furthermore, a plurality of conductive lines 304 may be provided such that each of the conductive lines 304 may extend from above one of the active regions 311 to another one of the active regions 311, thereby defining a chain of conductive lines 304. Furthermore, a plurality of direct contact structures 350 is provided so as to electrically connect the lines 304 to doped portions of the active regions 311, wherein the contact structures 350 may have any design configuration, for instance based on conventional configurations, for instance according to the device 100, or on the basis of any other configuration, such as the structures 250S, so as to reduce any leakage currents. The contact structures 350 may be provided in any design, for instance the structures 350 may be provided with, at each end, portions of respective conductive lines 304 to provide a high number of contacts to the active regions 311, thereby obtaining a high statistical relevance of electrical measurement data obtained by using the test structure 360. Furthermore, in some illustrative embodiments, the test structure 360 may comprise a contact pad 361 that is electrically connected to the plurality of active regions 311, for instance by contacting the pad 361 with one of the active regions 311. It should be appreciated that a contact pad 361 may be connected to respective highly doped portions of the active regions 311, as, for instance, previously explained with reference to the regions 107e, 107, 207 and 207e. For example, the contact pad 361 may be connected to one or more of the active regions 311 by an appropriately designed conductive line 304, which may in turn be connected to the doped portion of the region 311 by a respective contact structure 350.

As previously discussed, the active regions 311 may correspond to N-active regions, i.e., to semiconductor regions including a body region of a P-conductivity in combination with highly N-doped portions, such as the portions 207, 207e previously described when referring to the device 200. For example, for a P-predoped substrate material, the respective body regions (not shown) of the active regions 311 may be electrically connected to the substrate, as previously explained with reference to the device 200. On the other hand, if an N-predoped substrate material may be used, an N-active region has to be formed by first providing respective P-wells to establish a P-type body region. In this case, the P-well would not be electrically connected to the substrate material. Similarly, for forming a P-active region 311 in a P-predoped substrate material, an N-well has to be formed first and subsequently an appropriate highly doped P-type portion has to be formed in the corresponding N-well. Also, in this case, the respective body region would not be connected to the respective substrate material. Thus, the test structure 360 may further comprise a contact structure 362 that may be connected to the substrate material, if the substrate material is internally electrically connected to the body regions of the active regions 311. For example, for a P-predoped substrate material and N-active regions 311, the contact structure 362 may represent a substrate contact, thereby establishing an electrical connection to the substrate and thus the body regions of each of the active regions 311. In this case, the contact structure 362 may be provided within an appropriately designed isolation structure, thereby reliably insulating the contact structure 362 from any highly doped portions of the active regions 311.

In other cases, if the substrate material is not electrically connected to the respective body regions of the active regions 311, for instance for any of the above-discussed configurations or in the case of an SOI device in which the active regions 311 would be isolated by a buried insulating layer, while the lateral isolation is provided by the isolation structures 303, the contact structure 362 may be configured so as to be connected to each of the body regions of the active regions 311. For example, for a bulk configuration, the plurality of active regions 311 may be formed in a common well region, for instance an N-well for a P-predoped substrate material, wherein the isolation structures 303 may not entirely extend down to the entire depth of the corresponding N-well region. In this case, the contact structure 362 may connect to the N-well at any appropriate location, thereby providing an electrical connection to each body region of each of the active regions 311. In some illustrative embodiments, the test structure 360 further comprises a contact pad 363 via which the contact structure 362 may be accessible by external measurement devices.

The semiconductor device 300 comprising the test structure 360 may be formed on the basis of any desired manufacturing sequence, as for instance described with reference to the devices 100 and 200, wherein appropriate design criteria such as the overall size of the active regions 311, indicated as 311L and 311W, the dimensions of the isolation structures 303, indicated as 303D, and the dimensions of the conductive lines 304, indicated as 304W, thereby also determining the dimensions of the contact structures 350, may be used so as to estimate the resulting electrical characteristics of the test structure 360 on the basis of the predetermined design criteria. Consequently, after forming the test structure 360, which may be performed concurrently with the formation of actual contact structures, such as the structure 250S, in other device areas, electrical measurement data may be obtained, for instance by connecting the test structure 360 to external test devices via the contact pads 361, 363. For instance, for a given voltage applied to the pads 361, 363, the resulting current flow may be determined and may therefore indicate the amount of leakage current produced by the test structure 360. If, for instance, the test structure 360 has been formed on the basis of minimum device dimensions with respect to pitch and size of the components involved, the robustness of the corresponding manufacturing sequence may be estimated on the basis of the resulting leakage currents. Consequently, the manufacturing process may be reliably monitored and evaluated on the basis of the test structure 360.

In some illustrative embodiments, a plurality of test structures 360 may be provided, each of which may be formed in accordance with different design criteria so as to obtain a statistically relevant indication on the robustness of a respective manufacturing sequence in view of device dimensions and the like. It should be appreciated that the test structure 360 or an appropriate number thereof may be formed according to various design criteria and may be provided at specific test substrates, or in other cases may be formed on product substrates so as to enable the evaluation of the process flow for each individual product substrate.

FIG. 3b schematically illustrates the semiconductor device 300 comprising the test structure 360 according to a further illustrative embodiment, in which the chain 304c of conductive lines 304 is designed such that a single contact structure 350 may electrically contact two conductive lines 304 in each of the active regions 311. Consequently, a single design of the contact structure 350 may be used for connecting respective two of the conductive lines 304 in each active region so as to facilitate the design of respective lithography mask layouts.

It should be appreciated that the number of individual conductive lines 304 that form the chain 304c of contact lines and contact structures may be selected according to the desired "sensitivity" of the test structure 360 and the available space in the semiconductor layer 302. That is, by providing a large number of members for the contact chain, a high statistical relevance may be obtained with respect to the detection of any contact failures, since, with an increased number of contact structures, an increased probability for creating a contact failure may also be obtained. Consequently, by providing a sufficient number of contact structures, the respective contact failure behavior of sophisticated device areas, such as memory areas, may be appropriately "simulated" by the test structure 360. Furthermore, even a minor increase of leakage current per each contact structure 350, caused by a general minor insufficiency of the respective process flow, may be detected, since the test structure 360 may be sensitive for the accumulated leakage current for a high number of devices, thereby providing a high degree of sensitivity. If a plurality of test structures 360 may be provided, for instance based on different design criteria, a dependency of electrical characteristics of the test structures 360 with respect to the design criteria may be established and may be used for determining appropriate process parameters for the formation of actual contact structures in product substrates.

As a result, the subject matter disclosed herein provides techniques and semiconductor devices having an enhanced robustness with respect to a manufacturing flow in forming direct contact structures by enhancing the etch selectivity during the formation of contact openings on the basis of the provision of metal silicide in the exposed surface portions of the contact opening and/or by providing an appropriately designed test structure including a chain of conductive lines and respective direct contact structures in order to determine electrical characteristics of the test structure which may be correlated to the manufacturing sequence and the configuration of the contact structures. Consequently, in particular, contact structures of sophisticated semiconductor devices may be improved in terms of defect rate and reliability, thereby also contributing to overall device performance and reliability.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
    an active region defined in a semiconductor layer;
    a conductive line formed above a portion of said active region;
    an offset spacer formed on sidewalls of said conductive line, said offset spacer comprising a dielectric material;
    a metal silicide region formed on a portion of said active region adjacent to said conductive line, wherein an edge of said metal silicide region is substantially aligned with said sidewalls of said conductive line; and
    a contact structure comprised of a conductive material, said conductive material connecting to said conductive line and a highly doped portion of said active region, said contact structure being separated from said highly doped portion of said active region by said metal silicide region and from said sidewalls of said conductive line by said offset spacer.

2. The semiconductor device of claim 1, wherein said conductive line comprises a metal silicide at an upper portion thereof.

3. The semiconductor device of claim 1, wherein a vertical dopant concentration distribution of said highly doped portion in said active region at sidewall areas of said conductive line positioned above said active region corresponds to a vertical dopant concentration distribution of drain and source extension regions of a transistor formed in and above said active region.

4. The semiconductor device of claim 1, wherein a vertical dopant concentration distribution of said highly doped portion in said active region at sidewall areas of said conductive line positioned above said active region corresponds to a vertical dopant concentration distribution of deep drain and source regions of a transistor formed in and above said active region.

5. The semiconductor device of claim 1, wherein said conductive line comprises polysilicon.

6. The semiconductor device of claim 5, wherein said conductive material of said contact structure comprises a first material as a barrier material and a second material in the form of a fill material.

7. The semiconductor device of claim 1, wherein said dielectric material comprises one of silicon dioxide and silicon nitride.

8. A semiconductor device, comprising:
    a test structure formed in a region of a semiconductor layer of said semiconductor device, said region comprising a dopant of a first conductivity type, said test structure comprising:
        a plurality of active regions formed in said region of said semiconductor layer, wherein a body region of each of said plurality of active regions comprises said dopant of said first conductivity type;
        a plurality of isolation structures positioned to isolate said plurality of active regions from each other;
        a plurality of conductive lines, each of said plurality of conductive lines extending from above one of each of said plurality of active regions to above another one of each of said plurality of active regions to form a chain of said plurality of conductive lines
        a doped region formed in each of said plurality of active regions and adjacent to a respective one of said plurality of conductive lines formed thereabove, said doped region comprising a dopant of a second conductivity type that is opposite of said first conductivity type; and
        a plurality of contact structures positioned to connect each of said plurality of conductive lines with a respective one of said plurality of doped regions having said second conductivity type.

9. The semiconductor device of claim 8, further comprising a common contact connected to each of said body regions.

10. The semiconductor device of claim 9, wherein said first conductivity type is P-type and said second conductivity type is N-type.

11. The semiconductor device of claim 9, wherein said first conductivity type is N-type and said second conductivity type is P-type.

12. The semiconductor device of claim 8, further comprising a second test structure having substantially the same basic configuration as said test structure except for different design dimensions with respect to pitch and size of said active regions, isolation structures and conductive lines.

13. The semiconductor device of claim 8, further comprising a common contact connecting to said chain of said plurality of conductive lines.

14. The semiconductor device of claim 8, wherein at least one of each of said plurality of contact structures is positioned to contact two of said plurality of conductive.

* * * * *